United States Patent

Martin et al.

[11] 4,048,508
[45] Sept. 13, 1977

[54] APPARATUS FOR DOPING A SEMICONDUCTOR CRYSTALLINE ROD

[75] Inventors: Joachim Martin; Ernst Haas, both of Erlangen; Manfred Schnoeller, Haimhausen, all of Germany

[73] Assignee: Siemens Aktiengesellschaft, Munich, Germany

[21] Appl. No.: 603,680

[22] Filed: Aug. 11, 1975

[30] Foreign Application Priority Data

Aug. 12, 1974 Germany .............................. 2438710

[51] Int. Cl.² .............................................. B01J 17/34
[52] U.S. Cl. .................................. 250/492 A; 250/456
[58] Field of Search .................. 250/492 A, 439, 452, 250/454, 455, 456

[56] References Cited

U.S. PATENT DOCUMENTS

| 757,806 | 4/1904 | Giersiepen | 250/455 |
|---|---|---|---|
| 1,574,884 | 3/1926 | Hendricks | 250/452 |
| 2,087,751 | 7/1937 | Buttolph | 250/454 |
| 3,132,251 | 5/1964 | Maud et al. | 250/455 |

FOREIGN PATENT DOCUMENTS

| 1,555,510 | 12/1968 | France | 250/492 |

*Primary Examiner*—Alfred E. Smith
*Assistant Examiner*—T. N. Grigsby
*Attorney, Agent, or Firm*—Hill, Gross, Simpson, Van Santen, Steadman, Chiara & Simpson

[57] ABSTRACT

An apparatus for doping a semiconductor crystalline rod by nuclear or radiogenic reactions comprised of a hollow irradiation housing having axially and rotatably movable rod support means within the chamber thereof and a neutron conductive sleeve connected with the housing and providing communication between a neutron source and the housing chamber. Accurate and controlled doping of a semiconductor crystalline rod mounted on the rod support means within the housing chamber occurs via controlled rod movement in relation to the neutron source.

35 Claims, 2 Drawing Figures

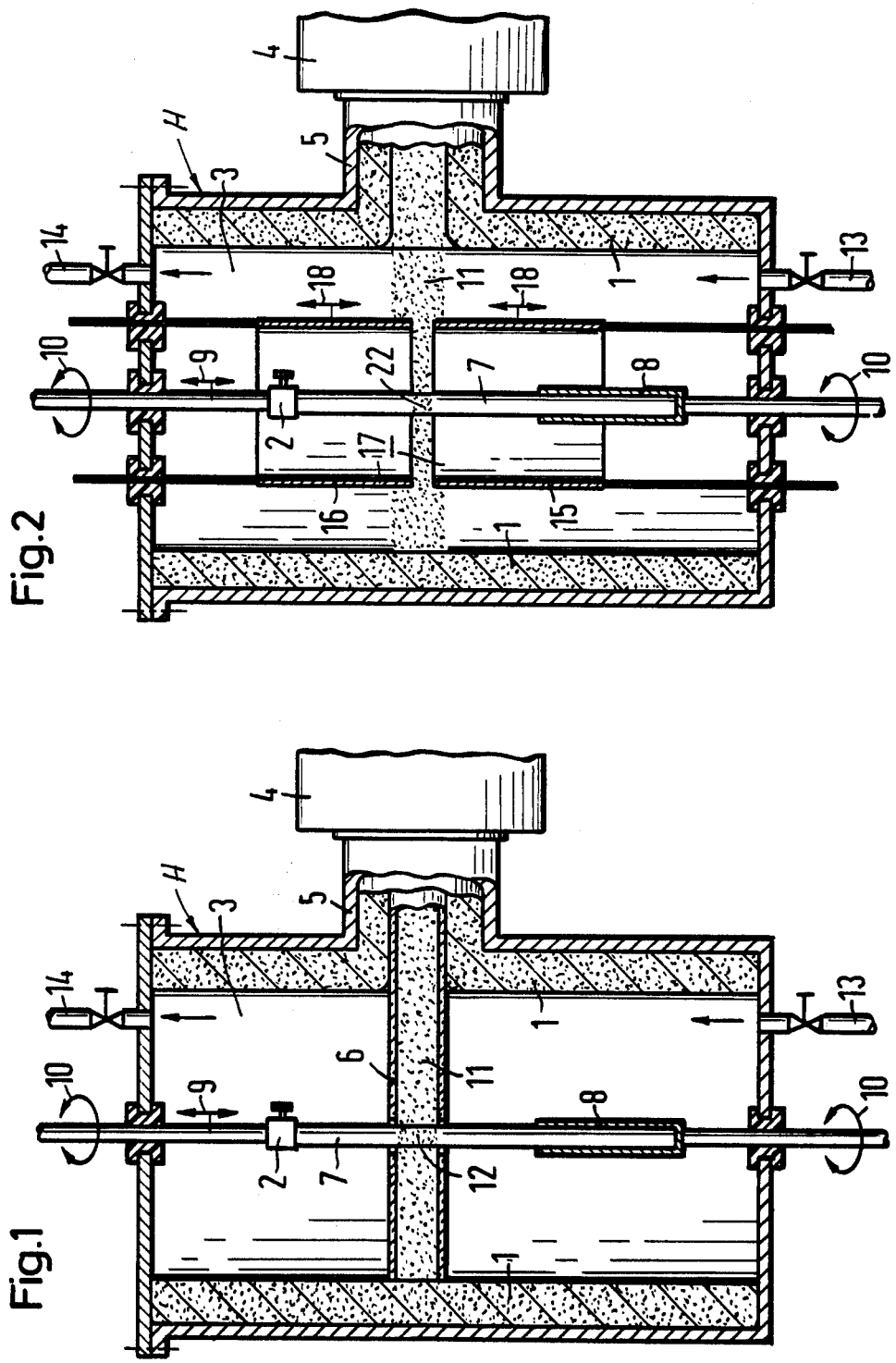

APPARATUS FOR DOPING A SEMICONDUCTOR CRYSTALLINE ROD

BACKGROUND OF THE INVENTION

1. Field of the Invention

The present invention relates to an apparatus for predetermined and reproducible formation of doping material in a semiconductor crystalline rod, particularly a silicon monocrystalline rod, by nuclear reactions.

2. Prior Art

Silicon rods having a predetermined dopant concentration are required for the production of high quality semiconductor components. During the production of such doped rods, the desired dopant concentration must be distributed as homogeneously as possible over the volume of the rod, both in the radial and axial directions.

Various processes are known which seek to provide homogeneously doped semiconductor rods. Generally, the doping of a semiconductor rod is conducted during the deposition of a semiconductor material from a gas phase thereof by thermal decomposition of a suitable gaseous compound yielding the semiconductor material on a heated carrier body or mandrel. The gaseous compound of the desired dopant material is mixed with the gaseous compound of the semiconductor material and simultaneously decomposes and the dopant and semiconductor material are simultaneously precipitated on the carrier body. A resultant crystalline rod produced in this manner is polycrystalline in nature and must be converted into the monocrystalline state by a subsequent zone melting process. During this process, the dopant concentration often changes in an uncontrollable manner and substantially higher (than actually desired) initial doping concentrations must be used to insure that the desired dopant concentration is still contained in the final monocrystalline product, which may require a plurality of zone melting cycles. Thus, in the zone melt process, the polycrystalline rod must be doped during the deposition process directly from the gas phase or via a highly doped core in such a manner that a desired specific resistance or specific recombination center density is achieved over the entire rod length, with proper compensations for the zone pulling and evaporation effects. However, it is not possible to achieve high concentration of dopant substances in the finished monocrystalline rod in this manner. Further, high concentrations of dopant substances close to the solubility limit ($10^{19}14\ 10^{20}\,cm^{-3}$) cannot be obtained by doping from a gas phase process wherein a gas stream charged with a dopant is blown onto a molten zone. In conventional methods, it is also difficult to produce lower dopant concentrations, for example, $10^{13}$–$10^{14}$ $cm^{-3}$ in an accurate and reproducible manner.

Generally, the prior art apparatus used for practicing the above-described processes comprises an evacuable hollow container or housing in which a semiconductor crystalline rod is supported vertically by rod holders extending through the top and bottom walls of such a container. A select dopant is either mixed with a gaseous semiconductor compound in a carrier gas stream and blown onto the melt zone of the rod, which has been heated by the passage of electric current so that the dopant and semiconductor compound thermally decompose on the rod (C-process) or the dopant is directly fed to the molten zone by means of a carrier gas stream during a crucible-free zone melting process. In the latter process, boron and phosphorus compounds which are easy to handle and evaporate at relatively low temperatures are typically used as dopants. The doping dosage is typically controlled by valve means.

A substantial disadvantage of such apparatus is that the valve means used for the dosage control of the dopants fail to act in an accurate and reproducible manner. Of course, this effects the reproducibility of the dopant concentration in a crystalline silicon rod produced in this manner. Further, such processes and apparatus used to conduct them produce a more or less inhomogeneous distribution of dopants after the zone melt defining procedure.

SUMMARY OF THE INVENTION

The invention provides an apparatus for producing a predetermined and accurately reproducible doping of a semiconductor rod which substantially eliminates the aforesaid prior art disadvantages. By following the principles of the invention, a substantially homogeneous distribution of a dopant within a rod, both along the rod length and across a cross-section thereof, is achieved in a simple, accurate and economical manner.

The apparatus of the invention generally comprises a hollow housing having an irradiation chamber therein, with the housing walls formed of a low radiation-absorbing material, such as aluminum, an iron-tin-zirconium alloy, quartz, a polymerized hydrocarbon such as polyethylene, etc. Axially and rotatably movable rod support means are mounted within the irradiation chamber for vertically supporting a semiconductor rod. A connection means is coupled to a side wall of the housing to provide radiation communication between the irradiation chamber and a radiation source so that a controlled beam of radiation can be directed to a portion of a rod mounted on the support means within the chamber. A mechanically or electronically controlled drive means is coupled to the rod support means for effecting controlled axial and rotational movement of the rod during irradiation.

In one preferred embodiment, the connection means comprises a neutron conductor, such as a reflective glass tube or a graphite tube. The apparatus of the invention may also include a masking absorber or shutter means composed of a radiation absorbent material, such as Cd, Gd or B, mounted within the irradiation chamber to protect rod areas away from the radiation beam from stray radiation and eliminate any inhomogeneities in the radiation field thereby facilitating production of a homogeneously doped rod. The apparatus may also include an appropriate heat-exchange circuit coupled with, for example, the rod support means and/or the housing walls to maintain a constant temperature thereof.

BRIEF DESCRIPTION OF THE DRAWINGS

FIG. 1 is a schematic side elevational view of an exemplary embodiment of an apparatus constructed and operating in accordance with the principles of the invention; and FIG. 2 is a somewhat similar view of another exemplary embodiment of an apparatus constructed and operating in accordance with the principles of the invention.

DESCRIPTION OF THE PREFERRED EMBODIMENTS

The invention provides an apparatus for effecting a predetermined reproducible doping of a semiconductor rod and through the use of which a substantially homogeneous distribution of dopant in a rod, both across the rod length and across the rod cross-section is readily obtained in a simple, accurate and economical manner.

In accordance with the principles of the invention, an apparatus is provided for the predetermined and reproducible doping of a crystalline semiconductor rod by the formation of doping atoms therein via nuclear reactions initiated by irradiating said rod with radiation, such as neutron radiation. Generally, the apparatus comprises a hollow housing having side and end walls joined together to define an irradiation chamber therein. A rotationally and axially movable rod support means is mounted on end walls of the housing and extends into the chamber thereof for vertically supporting a crystalline rod within the chamber. Controllable drive means is coupled with the rod support means and adapted to effect controlled axial and/or rotational movement thereof. A connection means is provided along a side wall of the housing for providing communication between a radiation source outside of the housing and the irradiation chamber within the housing.

The invention is based on the observation (disclosed in an article by Tanenbaum and Mills, in the publication "J. Electrochem. Soc.", Vol. 108 (1961), pages 171 through 176), that by irradiating silicon crystals with thermal neutrons it is possible to produce a homogeneous n-conductivity in such crystals. The natural isotope $Si^{30}$ contained in silicon is first converted into the unstable isotope $Si^{31}$ by the absorption of a thermal neutron and the emission of $\gamma$-radiation. This unstable isotope is then converted into stable $P^{31}$ (phosphorus) isotope by the emission of $\beta^-$-radiation with a half-life period of 2.62 hours. During the socalled radiogenic doping of silicon in accordance with the reaction:

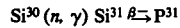
$$Si^{30}(n, \gamma) Si^{31} \xrightarrow{\beta^-} P^{31}$$

assuming that the $Si^{31}$ has fully decayed and that the amount of the $Si^{30}$ used up is negligible, the following simple equation applies:

$$N_p = 1.7 \times 10^{-4} \Phi \cdot t$$

wherein
$N_p$ is the phosphorous concentration in atoms/cm$^3$;
$\Phi$ is the density of the termal neutron flux in neutrons/cm$^2 \cdot$ sec.; and
$t$ is the irradiation time in seconds.

In a typical embodiment of the invention, the radiation used is in the form of a neutron beam which is obtained from a suitable source, such as a nuclear reactor and is focused into the irradiation chamber by means of a neutron conductor. However, the invention is not limited to the use of a neutron beam as the radiation source and it is possible to use any suitable radiation source which provides, for example, protons, deuterons, $\gamma$-photons, $\alpha$-particles or He$^3$ particles for irradiating a semiconductor crystal whereby nuclear transformation is effected within the irradiated crystal to produce doping atoms. However, for the sake of clarity and simplicity, the invention will be further described with reference to the use of a neutron source.

The apparatus of the invention includes a housing having a hollow irradiation chamber therein. Preferably, the housing structure is composed of aluminum, high-grade steel, a zirconium alloy containing tin and iron therein, quartz or a polymerized hydrocarbon material, such as polyethylene.

Since a high degree of purity or cleanliness is required within the irradiation chamber, the radiation housing is provided with inlet and outlet means for passing a protective or shielding gas such as helium, through the irradiation chamber.

A connection means is provided along a side wall of the housing for connecting an exterior radiation source with the irradiation chamber whereby the radiation field provided by the radiation source can be focused into a select zone of the irradiation chamber. Preferably, such connection means comprises a tube or sleeve formed of a suitable material. In embodiments where neutron radiation is utilized, the connection means comprises a neutron conductor, preferably a reflective gas tube or graphite blocks.

A rod support means within the irradiation chamber is preferably composed of a material having a low radiation absorption coefficient, such as aluminum, etc.

In order to dissipate any heat produced during the crystal irradiation process, the rod support means, the housing structure, etc. may be suitably cooled, for example, by coupling with an appropriate heat-exchange circuit. The protective gas circulating within the irradiation chamber may also be maintained at a select temperature by an appropriate heat-exchange circuit.

The apparatus of the invention may also include a neutron (or other radiation) absorber diaphragm or shutter means positioned within the irradiation chamber. Absorber or shutter means is preferably axially moved in relation to the semiconductor rod and/or the radiation beam within the irradiation chamber. In embodiments using such an absorber or shutter means, nuclear transformations and formation of doping atoms can then occur only in the areas of the rod not protected by such absorber means. The use of such an absorber means eliminates inhomogeneities in the radiation field and permits a desired doping program to be set up along the rod. The absorber means may include walls having different thicknesses so as to facilitate producing differing doping concentrations.

The absorber means is preferably formed of a suitable radiation-absorbing material. In embodiments where neutron radiation is utilized, a neutron-absorbing element, preferably cadmium gadolinium or boron, may be used to form the absorber means. The absorber means may be in the form of a molded body, a foil or a vapor-deposited layer. In instances where the absorber means comprises a vapor-deposited layer, the layer may be applied to a suitable carrier or support body, comprised of an inert material, such as quartz, or such a layer may be deposited directly on select areas of the semiconductor rod surface being treated. Such vapor-deposited layer may be produced by vapor-deposition of one or more extremely pure metals, either directed on the surface of the semiconductor rod or on a protective layer of SiO$_2$ on the surface of such rod. Embodiments utilizing this feature of the invention have the advantage of good heat dissipation and good exploitation of the irradiation position. Any surface impurities produced in this manner may be eliminated by etching after the irradiation process has been completed.

The absorber means may also be composed of a compound containing an radiation-absorber element, for example, an oxide of one of the earlier-mentioned elements. Such a compound may be compressed to form a molded body or may be in the form of a solution which contains a high concentration of a strongly absorbing isotope of the absorber element (for example, $Cd^{113}$, $Gd^{157}$ and/or $B^{10}$) and supported in a suitable container, for example, a quartz cylinder.

For a more economical utilization of the radiation source, instead of treating only a single semiconductor rod, the invention includes treating a group or bundle of rods which are arranged on an axially and rotatably movable palette or the like which is rotatable about a vertical axis of the rods in such a manner that on the average, each volume unit of the rod material being doped dwells on equal length of time (or if desired, for a predetermined different length of time) in the focused or maximum radiation field. As will be appreciated, silicon is a relatively weak neutron absorber so that the neutron field is only slightly altered by the flow reduction occurring during the practice of such an embodiment.

In instances of nuclear reactions initiated by focused high-speed neutrons produced in a neutron generator as a narrow beam, the neutron irradiation may be intensified in dependence upon location and can be controlled by deflection of the ion flow which initially strikes the target area. Accordingly, at least some of the inner surfaces of the irradiation chamber, such as the side walls thereof, are preferably at least partially formed of a radiation (neutron)-reflective material.

Suitable radiation sources for the process of the invention include nuclear reactors, particle accelerators and other radionucleide sources.

With the apparatus of the invention, the crystalline semiconductor rod being doped is movable in relation to the radiation source both in the rod axial direction and in the rod horizontal direction (by rotation) so that, by using, for example, a stationary neutron source, and controllably moving the rod, the neutron beam describes a helical path on the outer surface of such a rod. The doping concentration produced is then determined not only by the neutron flux density $\Phi$ but also by the speed of movement of the rod (as exemplified by the distance between the turns of the helical path), i.e. the irradiation time in the neutron stream.

In embodiments where an absorber means in not utilized, a desired dopant concentration along the rod is determined by the controlled axial movement of the rod, which is transmitted thereto via a drive means attached to the rod support means. To achieve such controlled axial movement, the rod support means may be connected to a ferromagnetic core which is suitable coupled to drive electromagnets positioned outside the irradiation chamber. Such axial movement of the rod may also be controlled via a process computer which predetermines a desired doping program to achieve a desired dopant concentration in the rod.

In the drawings, like reference numberals have been utilized to designate like elements. A housing structure H having side and end walls joined together to define a hollow irradiation chamber 3 is formed of a suitable material, for example, aluminum. A rod support means, such as rod clamp member 2, also made of aluminum extends through a wall of the housing H and into irradiation chamber 3. A neutron source 4 is connected by a connection means 5 along a side wall of housing H to provide communication between the neutron source 4 and the chamber 3. Preferably, the connection means 5 includes a neutron conductor 6, such as a reflective glass tube. The interior side walls of housing H and of connection means 5 may be provided with a graphite lining 1. An undoped monocrystalline silicon rod 7, for example, having a diameter of 30 mm, is clamped vertically in the rod clamp 2 (the top wall of the housing H may be opened and closed to provide access to the chamber 3). In the embodiment shown, the free lower end of the rod 7 is supported in a socket 8, also composed of aluminum and which is coupled to a suitable support means extending through the lower wall of the housing H. However, a clamp member substantially identical to clamp member 2 may also be utilized at the lower end of the rod. The rod support means (rod clamp 2 and socket 8) is coupled to a drive means (not shown) located outside the housing H so that the rod support means and the silicon rod 7 supported 7 therein can be subjected to controlled axial movement, as schematically indicated by the double-headed arrow 9 and to rotational movement as indicated by the curved double-headed arrow 10. By appropriate mechanical and/or electrical control of the drive means (which may include ferromagnetic cores attached to the rod support means and electromagnets away therefrom but operatively coupled to such core for controlled movement of the rod), an operator may produce a desired axial and rotational movement of the rod means and rod supported therebetween so as to achieve a homogenized doping of the so-heated rod. The housing H is also provided with a valve-controlled gas supply line 13 and a valve-controlled gas discharge line 14 so that a protective gas can be selectively circulated through the chamber 3.

The stationary neutron source 4 produces a neutron beam 11 (schematically illustrated by a plurality of dots) which is focused or guided by the neutron conductor 6 toward the rotating monocrystalline silicon rod 7 which may simultaneously be subjected to a specific axial movement determined by a desired doping in a zone 12 of the rod irradiated by the neutron beam 11. Such specific and accurately reproducible movement may be achieved, for example, by including a process computer operationally coupled to a drive means operating on the rod support means.

Because the rod support means and the attached silicon rod 7 are, in accordance with the desired doping program, constantly moved in and out of the irradiated zone by means of the drive means (as indicated by the arrow 9) and rotated about its longitudinal axis (as indicated by the arrow 10), the neutron beam 11 traces or describes a helical path on the outer surface of the rod. The distance between the individual turns of such a helical path, i.e. the period of dwell of the irradiated portion of the rod in the neutron stream, corresponds to the value of the dopant concentration which is introduced into the irradiated portion of the rod via the earlier explained nuclear reaction. Of course, the doping concentration is also dependent upon the neutron flux density $\Phi$.

In the embodiment of the apparatus provided by the invention illustrated at FIG. 2, a slotted absorber or shutter means 17 is mounted in an axially movable manner within the chamber 3 and in operating relation with the neutron beam 11. In the embodiment shown, the absorber means 17 completely encompasses the silicon rod 7 at portions thereof above and below the neutron beam 11. The absorber means 17 is composed of a neutron-absorbent material, for example, cadmium. In the embodiment shown, the absorber means 17 is composed of two parts 15 and 16 which are arranged to be axially displaceable in relation to the silicon rod 7 and in relation to the neutron source 4, such as schematically illustrated by the double-headed arrows 18 so that by moving the upper absorber means part 16 and the lower absorber means part 15 either away from or toward one another, it is possible to enlarge or reduce the slot therebetween and thus vary the width of the irradiated zone 22 on the silicon rod 7. Since axial movement of the rod 7 is also occurring, a series of rod portions doped to different concentrations may be readily produced along the entire length of a silicon rod in a single cycle. In this manner, a whole spectrum of various types of semiconductor components can be produced from a single monocrystalline silicon rod doped in this manner in a predetermined and reproducible fashion. Doping with this type of apparatus and precedure results in a substantial saving of material and reduces the time requirements. Of course, the doping concentration in the rod may also be influenced by varying the beam density.

Apparatus constructed in accordance with the principles of the invention provide the following advantages in comparison with known doping apparatuses:

1. A predetermined homogeneous reproducible dopant concentration is readily achieved and thus provides an improved material yield in all directions of the crystal rod, even in instances when relatively large diameter rods are utilized;

2. Lower costs, due to reduction in time required, in comparison with homogenization by crucible-free zone melt processes;

3. The ability to effect a predetermined, locally variable doping concentration by irradiating at varying intensities, as a result of which smoothening of dopant concentration gradients is achieved, in the case of p-conductive material by compensation and in the case of n-conductive material by differing radiogenic doping;

4. The production of a desired dopant concentration gradients and concentration profiles via the use of a radiation-absorbing diaphragm means and radiation conductors, which result in a very homogeneous doping within the so-defined rod zones;

5. No thermal loading (such as is present, for example, in diffusion doping processes), which results in a higher purity of the doped portions of the rod; and 6. The production of uniform and very highly ohmic semiconductor materials, in particular, of silicon, with a specific resistance of above 1000 $\Omega \cdot$ cm; and thus the production of stock materials for power rectifiers and thyristors with high current and blocking voltages (i.e. more than 5000 V) and excellent avalanche characteristics.

With the foregoing general discussion in mind, there is now presented detailed examples which will illustrated to those skilled in the art the manner in which the invention is carried out. However, the examples are not to be construed as limiting the scope of the invention in any way.

EXAMPLE I

An apparatus embodiment such as illustrated in FIG. 1 was utilized to achieve a specific resistance of 2000$\Omega$. cm n-conductivity in a monocrystalline silicon rod having a 30 mm diameter. The following parameters were utilized to achieve this result in a single cycle:

| | |
|---|---|
| Phosphorus concentration: | 200$\Omega \cdot$ cm, corresponding to 2.6 × 10$^{13}$ atoms cm$^{-3}$. |
| Thermal neutron flux: | 2 × 10$^{12}$ neutrons cm$^{-2}$ s$^{-1}$. |
| Axial feed rate of the rod support means: | 0.5 cm/h. |
| Rotational speed of the rod support means: | 10 revolutions per hour. |
| Annealing conditions after irradiation: | at least 10 minutes at a temperature of at least 800° C. |

EXAMPLE II

A substantially similar rod as in Example I was doped in the apparatus of FIG. 2 and the following parameters were utilized.

| | |
|---|---|
| Phosphorus concentration: | 1.3 × 10$^{13}$ atoms cm$^{-3}$. |
| Thermal neutron flux: | 4 × 10$^{12}$ neutrons cm$^{-2}$s$^{-1}$. |
| Axial feed rate of rod support means: | 2 cm/h. |
| Rotational speed of rod support means: | 60 revolutions per hour. |
| Cd-absorber means comprised of 2 mm-thick Cd sheet metal: | |
| Average absorber means slot opening: | 10 cm. |
| Variation range: | 2 to 20 cm. |

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention as claimed.

We claim as our invention:

1. An apparatus for predetermined and reproducible doping of a crystalline semiconductor rod by the formation of dopant atoms via radiogenic radiation initiated by irradiating such rod comprising:
   a housing having end and side walls joined together to define a hollow irradiation chamber therein;
   an axially and rotatably movable rod support means mounted on an end wall of said housing and extending into said chamber for supporting a semiconductor rod;
   a drive means operationally coupled with said rod support means for effecting controlled axial and rotational movement of said support means;
   a radiation source positioned outside said housing for producing a radiation field capable of initiating radiogenic reactions in a semiconductor rod; and
   a connection means mounted on a side wall of said housing for providing communication between said chamber and said radiation field.

2. An apparatus as defined in claim 1 wherein said connection means includes a radiation conductor therein.

3. An apparatus as defined in claim 1 wherein said radiation source is a neutron source.

4. An apparatus as defined in claim 3 wherein said neutron source is a nuclear reactor.

5. An apparatus as defined in claim 1 wherein said housing is formed of a material selected from the group consisting of aluminum, a zirconium alloy having tin and iron therein, a high-grade steel, quartz and a polymerized hydrocarbon material.

6. An apparatus as defined in claim 5 wherein said housing is formed of polyethylene.

7. An apparatus as defined in claim 1 wherein said housing includes a gas inlet means and a gas outlet means for passage of a shielding gas through said chamber.

8. An apparatus as defined in claim 1 wherein said connection means is a tube.

9. An apparatus as defined in claim 1 wherein said neutron source is a nuclear source and said connection means includes a neutron conductor.

10. An apparatus as defined in claim 9 wherein said neutron conductor is a reflective glass tube.

11. An apparatus as defined in claim 9 wherein said neutron conductor comprises graphite blocks.

12. An apparatus as defined in claim 1 wherein said rod support means is formed of a material having a low absorption coefficient for the radiation used to irradiate said rod.

13. An apparatus as defined in claim 12 wherein said rod support means is composed of aluminum.

14. An apparatus as defined in claim 1 including means for cooling said rod support means and said housing.

15. An apparatus as defined in claim 1 wherein said rod support means comprises an upper rod clamp member and a lower socket member.

16. An apparatus as defined in claim 15 wherein said socket member is composed of aluminum.

17. An apparatus as defined in claim 1 including an axially movable absorber means positioned within said chamber and in working relation with said connection means so as to protect select portions of said rod from said radiation field.

18. An apparatus as defined in claim 17 wherein said absorber means is axially movable relative to said rod.

19. An apparatus as defined in claim 17 wherein said absorber means is axially movable relative to said radiation field.

20. An apparatus as defined in claim 17 wherein said absorber means includes walls of various thickness dependent on a desired doping program being produced along said rod.

21. An apparatus as defined in claim 17 wherein said radiation source is a neutron source and said absorber means is composed of a neutron-absorbing element selected from the group consisting of Cd, Gd and B.

22. An apparatus as defined in claim 21 wherein said absorber means is a vapor-deposited layer supported by a carrier body composed of an inert material.

23. An apparatus as defined in claim 21 wherein said absorber means is a vapor-deposited layer supported by the outer surface of said semiconductor rod.

24. An apparatus as defined in claim 21 wherein said absorber means is composed of a compound of said neutron-absorbing element, said compound being formed into a molded body.

25. An apparatus as defined in claim 24 wherein said compound is an oxide.

26. An apparatus as defined in claim 21 wherein said absorber means comprises a solution within a quartz container, said solution having a high concentration of high-radiation absorbing isotopes of said neutron-absorbing element.

27. An apparatus as defined in claim 1 wherein the side walls of said housing are at least partially formed of a radiation-reflective material.

28. An apparatus as defined in claim 1 wherein said drive means comprises a ferromagnetic core connected to said rod support means and drive electromagnets positioned outside said housing and operationally coupled with said core.

29. An apparatus as defined in claim 1 wherein said drive means includes a process computer for control of the rod support means movement.

30. An apparatus as defined in claim 1 wherein said rod support means comprises a plurality of rod-holding members for supporting a plurality of semiconductor rods on a rotatable palette adapted to rotate about a vertical axis of said rods.

31. An apparatus as defined in claim 21 wherein said absorber means comprises a molded body.

32. An apparatus as defined in claim 21 wherein said absorber means comprises a foil.

33. An apparatus as defined in claim 21 wherein said absorber means comprises a vapor-deposited layer.

34. An apparatus as defined in claim 1 wherein said radiation source comprises a particle accelerator.

35. An apparatus as defined in claim 1 wherein said radiation source comprises a radionucleide source.

* * * * *